United States Patent [19]

Van Deventer

[11] Patent Number: 5,295,016
[45] Date of Patent: Mar. 15, 1994

[54] POLARIZATION INSENSITIVE AMPLIFICATION DEVICE

[75] Inventor: Mattijs O. Van Deventer, Leidschendam, Netherlands

[73] Assignee: Koninklijke Ptt Nederland, N.V., Groningen, Netherlands

[21] Appl. No.: 891,640

[22] Filed: May 29, 1992

[30] Foreign Application Priority Data

Jul. 15, 1991 [NL] Netherlands ............... 9101244

[51] Int. Cl.$^5$ ................... G02B 5/30; H01S 3/02
[52] U.S. Cl. ........................ 359/347; 359/333
[58] Field of Search ........... 359/346, 333, 344, 347; 372/703, 107

[56] References Cited

U.S. PATENT DOCUMENTS

| | | | |
|---|---|---|---|
| 4,900,917 | 2/1990 | Dixon et al. | 250/225 |
| 4,941,738 | 7/1990 | Olsson | 359/333 |
| 4,952,017 | 8/1990 | Henry et al. | 359/344 |
| 5,010,586 | 4/1991 | Mortimore et al. | 455/605 |

FOREIGN PATENT DOCUMENTS

| | | |
|---|---|---|
| 0405406A2 | 1/1991 | European Pat. Off. |
| 2000933 | 1/1990 | Japan |
| 2093623 | 4/1990 | Japan |
| 2098185 | 4/1990 | Japan |

OTHER PUBLICATIONS

Electronics Letters, No. 22, Oct. 25, 1990, Stevenage GB Herts., GB, 1913-1914, M. Sumida, "Polarisation Insensitive Configuration of Semiconductor Laser Amplifier".

*Primary Examiner*—Ian J. Lobo
*Attorney, Agent, or Firm*—Frishauf, Holtz, Goodman & Woodward

[57] ABSTRACT

A polarization-independent amplification device comprising an optical semiconductor amplifier. The amplification device input signal is fed to one side of the amplifier and a reflector is provided at the other side. The amplification device output signal, formed by the amplification device input signal reflected by the reflector and amplified by the amplifier, is taken off at the first side of the amplifier. The reflector is reciprocal, a signal or signal component fed thereto and having a polarization perpendicular to the principal axis of the amplifier being reflected as a reflection signal having a polarization which is virtually parallel to said principal axis and vice versa.

15 Claims, 1 Drawing Sheet

POLARIZATION INSENSITIVE AMPLIFICATION DEVICE

The invention relates to a polarization-independent amplification device comprising an optical semiconductor amplifier to one side of which the amplification device input signal is fed and at the other side of which a reflector is provided, the amplification device output signal, formed by the amplification device input signal reflected by the reflector and amplified by the amplifier, being taken off at the first side of the amplifier. Such a device is disclosed by the paper entitled "Polarization-independent Configuration Optical Amplifier" published in "Electronic Letters", Aug. 18, 1988, volume 24, No. 17, pages 1075 and 1076.

In optical communication systems, amplifiers are often used, in general optical semiconductor amplifiers, which have an amplification which is often heavily dependent on the polarization of the optical signal presented thereto.

According to the above-mentioned paper, to overcome said disadvantage use is made of a principle whereby the optical signal transverses the amplifier twice, namely once in the forward direction and once in the reverse direction, the polarization of the optical signal being rotated through 90° between the two transmission directions. For this purpose, the input signal is fed in a known manner to one side of the amplifier while a reflector is provided at the other side which, according to said paper, consists of a nonreciprocal Faraday rotator having a rotation angle of 45° and a mirror placed behind it. After the amplifier input signal has undergone a first amplification, the amplified signal passes through the Faraday rotator and is then reflected by the mirror. The signal reflected by the mirror again passes through the Faraday rotator and is amplified by the amplifier for a second time. At the first side of the amplifier, to which the input signal is fed, the amplified reflection signal appearing at said side is taken off as the amplification device output signal.

The combination of Faraday rotator and mirror should be regarded as a nonreciprocal reflector or reflector combination in relation to the polarization. Said reflector combination, which is also referred to as an orthogonal polarization reflector, reflects the light with a rotation of 90°, with the result that the total amplification, in the forward and return direction, will be independent on the direction of polarization of the optical signal fed to the amplifier. Since the signal passes through the same device twice for a rotation of 90°, it appears to be necessary for a nonreciprocal polarization-rotating component to be used.

The known orthogonal polarization reflector has, however, the disadvantage that the Faraday rotator is a bulky component, with the result that an additional lens is also needed, with the problem of alignment and reflections.

The object of the invention is to provide an amplification device of the type mentioned in the introduction in which above-mentioned disadvantages are avoided.

This object is achieved, according to the invention, in that the reflector is reciprocal, which is to say that a signal or signal component fed thereto and having a polarization perpendicular to the principal axis of the amplifier is reflected as a reflection signal having a polarization substantially parallel to said principal axis and vice versa.

It has been found that the polarization independence can also be achieved with simple reciprocal devices. In this case, a polarization reflection being performed instead of a polarization rotation.

In an embodiment, preferably to be used, of the invention, the reciprocal reflector consists of a retarder and a mirror provided behind it. Preferably, the retarder is a λ/4 retarder and the angle between one of the principal axes of the retarder and the polarization of the amplifier is equal to 45°.

In this case, it is possible to make do with a small λ/4 plate which is small in terms of size. Said plate can be very thin, with the result that a lens can be omitted, a compact unit thereby being obtained.

In one embodiment of the invention, the λ/4 retarder is formed by a section of birefringent glass fiber whose length is equal to $\frac{1}{2}n+\frac{1}{4}$ times the beat length, n being equal to zero or to an integer.

A very compact unit is obtained if the λ/4 retarder is integrated in the amplifier.

In the above-mentioned embodiments, it is very advantageous to use a coating layer having a high reflection as mirror, as a result of which the unit becomes still more compact.

In another embodiment of the invention, the reciprocal reflector consists of a loop reflector with a retarder incorporated therein. In a further elaboration of this, the loop reflector comprises a coupling device to whose outputs the ends of a glass fiber loop are connected, in which loop a 90° circular retarder is incorporated. In this case, the circular retarder is formed in a simple way by a twisted glass fiber section.

The invention will be explained in greater detail below by reference to the drawings. In the drawings.

The literature discloses a solution for rendering an amplifier, for example an optical semiconductor amplifier, less polarization-dependent, use being made of the principle that the signal is amplified twice, i.e. once in the forward direction and for a second time, in the reverse direction. Prior to the amplification in the reverse direction, the polarization of the once amplified signal is rotated. Because the input signal is amplified twice with different polarization directions, the total amplification will be less dependent on the polarization direction of the input signal. To achieve said effect, an orthogonal polarization reflector is used, the polarization of the input signal being orthogonally reflected after amplification by the optical amplifier. An embodiment of this comprises a Faraday rotator and a mirror.

The invention is based on the inventive insight that it is not necessary for every polarization direction to be reflected orthogonally. Such a reflection will be necessary solely for the horizontal and vertical direction of polarization, assuming that the amplifier has a horizontal principal axis of polarization. Proceeding from this, use can be made of a reflector which is reciprocal, a signal fed thereto and having a vertical polarization being reflected as a reflection signal having a virtually horizontal polarization and vice versa.

For the concepts of "reciprocal" and "nonreciprocal", reference is made to the paper entitled "A New Calculus for the Treatment of Optical Systems I . . . VIII" by R. C. Jones, published in the Journal of the Opt. Soc. Am., vol. 31, 1941, pages 488-503, vol. 32, 1942, pages 486–493, vol. 37, 1947, pages 107–112, vol. 38, 1948, pages 671–685, and vol. 46, 1956, pages 126–132.

Figure 1:
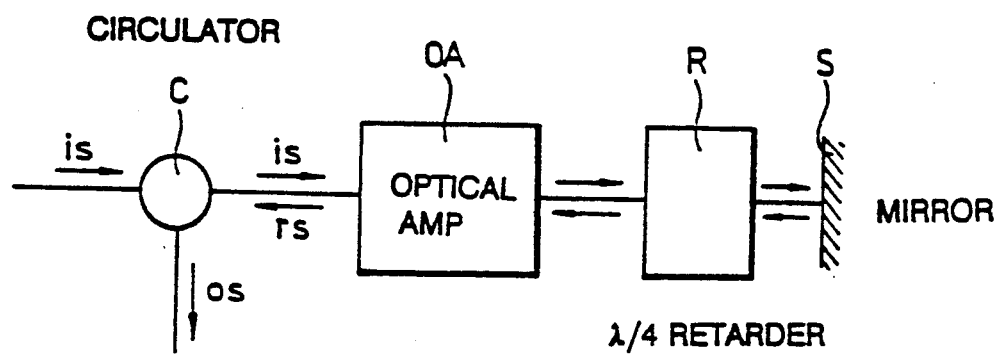
FIG. 1 shows an embodiment, preferably to be used, of the invention.

FIG. 1 shows an embodiment, preferably to be used, of the invention. Said embodiment comprises a circulator having at least three ports, the input signal is being fed to one port and being emitted at the adjacent port. Said adjacent port is connected to an optical amplifier, such as, for example, an optical semiconductor amplifier. Provided at the other side of the optical amplifier is a retarder R, in particular a λ/4 retarder, behind which a mirror S is situated. The angle between one of the principal axes of the retarder R and the polarization direction of the amplifier is preferably 45°.

A retarder is a reciprocal device. The signal fed thereto can be represented by two components whose polarization directions are mutually perpendicular. The retarder delays one component with respect to the other.

In the embodiment of FIG. 1, the amplification device input signal is fed to a port of the circulator C and reaches, via an adjacent port thereof, the optical amplifier OA. After amplification by the optical amplifier OA, the amplified input signal reaches the λ/4 retarder R with the above-mentioned delay property of the components of the amplified input signal. After being reflected by the mirror S, the signal again passes through the retarder R and the optical amplifier OA in the reverse direction. At the input of the optical amplifier, the amplified reflection signal rs appears and is separated from the input signal is by means of the circulator C. The amplified reflection signal can be taken off as amplifier output signal os at a third port.

Using the polarization-reciprocal reflector, which in this embodiment consists of the λ/4 retarder R and a mirror S, achieves the result that the output signal os is less polarization-dependent.

If the angle between one of the principal axes of the λ/4 retarder and the polarization of the amplifier is equal to 45°, an optimum polarization independence of the amplification is obtained. The simplest form of the retarder is a 45° λ/4 plate. Said plate can be very thin and can consequently be coupled directly to the components interacting therewith, i.e. the amplifier and the mirror. In other words, lenses can be omitted. It is clear that a compact unit is achieved in the case of this embodiment.

The λ/4 plate converts vertically linearly polarized light into circularly polarized light which is then reflected by the mirror circularly polarized in another direction of orientation (left-hand/right-hand). The λ/4 plate then converts the optical signal fed to it into horizontally polarized light. The converse takes place for a horizontally polarized optical input signal.

It has been found that the input signal is amplified with a polarization-independent amplification factor by means of the simple configuration described above, which consists solely of reciprocal components.

The λ/4 retarder can be formed with the same beneficial effect by a section of birefringent glass fiber whose length is equal to $\frac{1}{2}n+\frac{1}{4}$ times the beat length, n being equal to 0 or an integer.

The concept of beat length is used in the case of two propagating modes having a different propagation constant. When the two modes propagate over a distance of one beat length, the phase difference between the two modes has become 360°. Instead of "beat length", "coupling length" is also used. For the birefringent glass fiber, the two respective modes are the two perpendicular principal polarizations.

In order to construct the reciprocal reflector still more compactly, the λ/4 retarder is integrated in the amplifier. An optimum compact configuration is obtained if the mirror is formed by a coating layer having a high reflection and provided on the output face of the λ/4 retarder.

Figure 2:
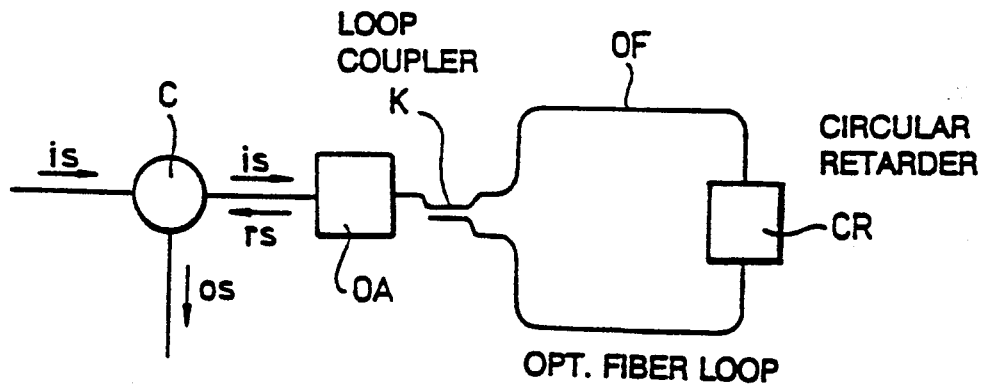
FIG. 2 shows a further beneficial embodiment of the invention.

FIG. 2 shows another embodiment of the invention in which the polarization-reciprocal reflector is constructed as a loop reflector having a reciprocal polarization rotation of 90°.

After passing through the circulator C, the input signal is fed to a coupling device, for example a 3 dB coupling device, after which the signal emerging from one output port is fed to the amplifier OA. The signal originating from the amplifier OA is presented via the coupling device K to one side of a glass fibre loop OF, the other side of said glass fiber being connected to the other output port of the coupling device K. Incorporated in the glass fiber loop OF is a 90° circular retarder CR. Said circular retarder may be implemented as a twisted glass fiber section. The circular retardation used in this case is also referred to as optical activity.

A 3 dB coupling device can furthermore be used as take-off device, for which a circulator C is chosen in the embodiment shown.

In the configuration shown in FIG. 2, the input signal is again amplified with polarization-independent amplification factor.

From the above it is evident that a polarization-independent amplification can be obtained with simple and compact reciprocal components.

I claim:

1. Polarization-independent amplification device comprising an optical semiconductor amplifier to a first side of which the amplification device input signal is fed and at a second side of which a reflector combination of a polarization modifying means and a reflector is provided, the amplification device output signal, formed by the amplification device input signal reflected by said reflector combination and amplified by said amplifier, being taken off at the first side of the amplifier, said amplifier having a principal axis, characterized in that said reflector combination is constituted by a retarder and a reflector, said retarder and said reflector being implemented in a reciprocal optical transmission medium, and wherein a signal or signal component which is fed to said reflector combination and has a polarization perpendicular to the principal axis of said amplifier is reflected as a reflection signal having a polarization substantially parallel to said principal axis and vice versa.

2. Polarization-independent amplification device comprising an optical semiconductor amplifier to a first side of which the amplification device input signal is fed and at a second side of which a reflector combination of a polarization modifying means and a reflector is provided, the amplification device output signal, formed by the amplification device input signal reflected by said reflector combination and amplified by said amplifier, being taken off at said first side of the amplifier, said amplifier having a principal axis wherein said reflector combination comprises a retarder and a mirror provided behind it and wherein a signal or signal component which is fed to said reflector combination and has a polarization perpendicular to the principal axis of said amplifier is reflected as a reflection signal having a polarization substantially parallel to said principal axis and vice versa.

3. Amplification device according to claim 2, characterized in that the retarder is λ/4 retarder and in that the angle between one of the principal axes of the retarder and the polarization of the amplifier is equal to 45°.

4. Amplification device according to claim 3, characterized in that the λ/4 retarder is formed by a section of birefringent glass fiber whose length is equal to $\frac{1}{2}n+\frac{1}{4}$ times the beat length, n being equal to zero or an integer.

5. Amplification device according to claim 3, characterized in that the λ/4 retarder is integrated in the amplifier.

6. Amplification device according to claim 3, characterized in that the mirror is formed by a coating layer having a high reflection.

7. Amplification device according to claim 3, characterized in that the λ/4 retarder is formed by a section of birefringement glass fiber whose length is equal to $\frac{1}{2}n+\frac{1}{4}$ times the beat length, n being equal to zero or an integer.

8. Amplification device according to claim 7, characterized in that the λ/4 retarder is integrated in the amplifier.

9. Amplification device according to claim 7, characterized in that the mirror is formed by a coating layer having a high reflection.

10. Amplification device according to claim 3, characterized in that the λ/4 retarder is integrated in the amplifier.

11. Amplification device according to claim 10, characterized in that the mirror is formed by a coating layer having a high reflection.

12. Amplification device according to claim 2, characterized in that the mirror is formed by a coating layer having a high reflection.

13. Polarization-independent amplification device comprising an optical semiconductor amplifier to a first side of which the amplification device input signal is fed and at a second side of which a reflector combination of a polarization modifying means and a reflector is provided, the amplification device output signal, formed by the amplification device input signal reflected by said reflector combination and amplified by said amplifier, being taken off at said first side of the amplifier, said amplifier having a principal axis, characterized in that said reflector combination is a loop reflector with a retarder incorporated therein as said polarization modifying means, said retarder having a retarding effect of a magnitude appropriate for producing, from said amplifier output signal having a polarization perpendicular to said principal axis of said amplifier and fed to said loop reflector, a reflected output fed from said loop reflector to said amplifier which reflected output has a polarization substantially parallel to said principal axis, and vice versa as regards said polarizations respectively perpendicular and parallel to said principal axis.

14. Amplification device according to claim 13, characterized in that the loop reflector comprises a coupling device to whose outputs the ends of a glass fiber loop are connected, in which loop said retarder incorporated therein is a 90° circular retarder.

15. Amplification device according to claim 14, characterized in that the circular retarder is formed by a twisted glass fiber section.

* * * * *